(12) United States Patent
Houston

(10) Patent No.: US 6,255,854 B1
(45) Date of Patent: Jul. 3, 2001

(54) FEEDBACK STAGE FOR PROTECTING A DYNAMIC NODE IN AN INTEGRATED CIRCUIT HAVING DYNAMIC LOGIC

(75) Inventor: Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/162,866

(22) Filed: Sep. 29, 1998

Related U.S. Application Data

(60) Provisional application No. 60/060,279, filed on Sep. 29, 1997.

(51) Int. Cl.[7] .............................................. H03K 19/096
(52) U.S. Cl. ................................ 326/98; 326/98; 326/95; 326/93
(58) Field of Search ................................ 326/83, 93, 95, 326/96, 97, 98, 112, 119, 121

(56) References Cited

PUBLICATIONS

Arthur H. Seidman & Jack L. Wainstraub, Electronics devices, discrete and integrated circuits, Charles E. Merrill Publishing Company, Copy Right 1977, p. 334.*

* cited by examiner

Primary Examiner—Michael Tokar
Assistant Examiner—Vibol Tan
(74) Attorney, Agent, or Firm—Dwight N. Holmbo; Wade James Brady, III; Frederick J. Telecky, Jr.

(57) ABSTRACT

An integrated circuit having dynamic logic (20) is disclosed that includes a dynamic node (NODE 1). A feedback stage protects the dynamic node (NODE 1) and includes a controllable current path (26) connected between a voltage supply and the dynamic node (NODE 1), where the controllable current path (26) has a control terminal. The feedback stage also includes a feedback path from the dynamic node (NODE 1) to the control terminal, where the feedback path includes a delay stage (27) providing a delay greater than intrinsic circuit delay.

22 Claims, 2 Drawing Sheets

FEEDBACK STAGE FOR PROTECTING A DYNAMIC NODE IN AN INTEGRATED CIRCUIT HAVING DYNAMIC LOGIC

This application claims benefit to Provisional Application 60/060,279 filed Sep. 29, 1997.

TECHNICAL FIELD OF THE INVENTION

This invention relates in general to the field of integrated circuits, and more particularly to a feedback stage for protecting a dynamic node in an integrated circuit having dynamic logic.

BACKGROUND OF THE INVENTION

One form of logic used in integrated circuits is dynamic logic. In general, dynamic logic involves the charging of dynamic nodes to a voltage level representing a high logic state. The dynamic node is then connected to a dynamic logic stage which generally comprises a plurality of transistors forming a plurality of potential paths to ground potential. If the inputs to the dynamic logic stage are such that a current path is created between the dynamic node and ground potential, the voltage level of the dynamic node is reduced and brought to a low logic state. Otherwise, the dynamic node remains at the high logic state. The dynamic node can feed a logic stage, such as an inverter, which can provide an output for the dynamic logic stage. As should be understood, the precharging of the dynamic node provides increased speed for the logic path because the node does not have to be charged to a logic high by the logic devices.

Integrated circuits having dynamic logic can be built upon various forms of conventional structures. For example, dynamic logic can be built in bulk integrated circuits formed in a well within a semiconductor substrate. The dynamic logic can also be built in a silicon-on-insulator environment in which the integrated circuit is formed in a silicon layer deposited above an insulator substrate.

One problem that arises with integrated circuits in general, and dynamic logic in particular, is the fact that a spurious pulse of current can cause an upset of the state of a dynamic node. The spurious pulse can be caused by various factors including voltage fluctuations, alpha particles and cosmic pulses. With silicon-on-insulator (SOI) circuits, a spurious current pulse can be particularly problematic. Typically for SOI transistors, it is desirable to keep the body floating and not tied to a specific voltage potential. In this situation, SOI transistors are susceptible to current leakage from the body to the source due to voltage swings on the source. When leakage occurs, a large drain current can be generated from the drain to the source due to a bipolar-like effect. Such a large drain current can clearly upset charge stored on a drain of such a transistor. Where the transistors that experience such drain current pulses are transistors within a dynamic logic stage, the loss of charge can result in a dynamic node being brought to an incorrect logic level. This can then produce inaccurate logic results for the dynamic logic.

One conventional solution to the problem of spurious pulses is to connect the body of the SOI transistor to ground potential or $V_{SS}$. However, a disadvantage of this solution is that it takes up area within the integrated circuit and also reduces the drive current of the transistors. It is preferable to allow the body to float rather than tie it to ground potential.

A second solution is to increase the junction leakage between the body and source of the transistors to avoid a large drain current pulse. This increased junction leakage reduces the beta of the bipolar-like effect thus decreasing the drain current. However, this solution has disadvantages which include the difficulty of providing the correct amount of leakage as well as the standby loss caused by the large junction leakage. Further, such leakage between the body and source reduces the advantage of having the floating body.

Similar problems with current pulses can be generated in bulk integrated circuits by ion strikes, such as alpha particles or cosmic pulses. In bulk transistors, an ion strike in the drain will generate an undesirable current through the drain to well junction. The problem with spurious pulses is not significant for bulk integrated circuits unless the size of the circuits have decreased to the point where capacitances hold charge within the same range as the spurious pulses caused by the ion strike. For example, some DRAM circuits and small scale logic circuits do experience problems created by ion strikes.

With respect to ion strikes, one conventional solution involves the hardening of memory cells such that the logic state of the cell is not altered by ion strikes. One solution for hardening memory cells is to provide delay in the feedback between cross coupled invertors so that the state of the cell does not flip because of a spurious pulse. Examples of such hardened memory cells are disclosed by U.S. Pat. Nos. 4,956,815; 4,912,675; and 4,914,629.

SUMMARY OF THE INVENTION

In accordance with the present invention, a feedback stage for protecting a dynamic node in an integrated circuit having dynamic logic is disclosed that provides advantages over conventional feedback protection for dynamic nodes.

According to one aspect of the present invention, an integrated circuit having dynamic logic is disclosed that includes a dynamic node. A feedback stage protects the dynamic node and includes a controllable current path connected between a voltage supply and the dynamic node, where the controllable current path has a control terminal. The feedback stage also includes a feedback path from the dynamic node to the control terminal, where the feedback path includes a delay stage providing a delay greater than intrinsic circuit delay.

A technical advantage of the present invention is the protection of a dynamic node against an upset pulse using a keeper transistor that is smaller than that possible with conventional protection schemes. The present invention thus allows a smaller keeper transistor for a given size of upset pulse and allows dynamic logic connected to the dynamic node to pull against a smaller keeper transistor.

A further technical advantage of the present invention is the reduction of the problem with bipolar leakage that can upset dynamic nodes in floating body silicon-on-insulator designs.

BRIEF DESCRIPTION OF THE DRAWINGS

A more complete understanding of the present invention and advantages thereof may be acquired by referring to the following description taken in conjunction with the accompanying drawings, in which like reference numbers indicate like features, and wherein.

DETAILED DESCRIPTION OF THE INVENTION

Figure 1A:
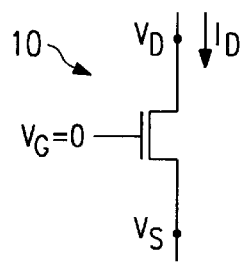
FIGS. 1A and 1B illustrate leakage current generated in a silicon-on-insulator transistor caused by a voltage swing at the transistor source.
Figure 1B:
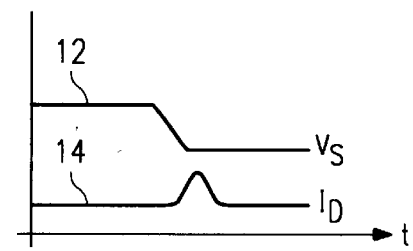

FIGS. 1A and 1B illustrate a leakage current generated in a silicon-on-insulator (SOI) transistor caused by a voltage swing at the transistor source. As shown in FIG. 1A, a transistor, indicated generally at 10, has a source, drain and gate. For transistor 10 with its gate turned off ($V_G$=0), a leakage pulse, $I_D$, can result from a voltage swing at the source $V_S$. This an be problematic in that the leakage pulse could lead to the loss of dynamic data or charge stored at the drain, $V_D$.

As shown in FIG. 1B, a voltage swing at the source, indicated by 12, can produce a drain current pulse, indicated by 14. In particular, when both the source and drain of transistor 10 are charged high, the floating body of transistor 10 typically goes high as well. If the source then transitions low, the body to source junction is forward biased. This can cause a small junction current to leak from the body to the source. Due to bipolar-like factors, the small leakage current from body to source can generate a large drain current pulse, $I_D$. This drain current pulse can then reduce charge stored at the drain and can disrupt a dynamic node to which the drain is connected. Other possible causes of a current pulse $I_D$ include ion strikes and glitches on the gate input $V_G$.

Figure 2:
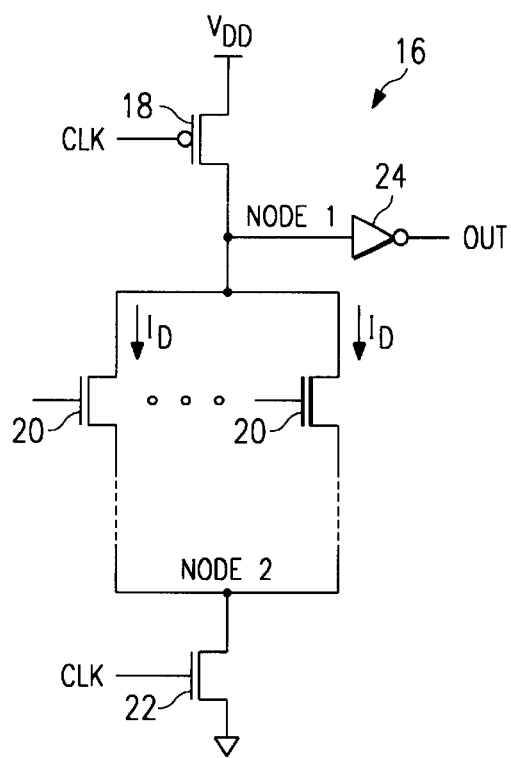
FIG. 2 is a circuit diagram of one embodiment of an integrated circuit having dynamic logic.

FIG. 2 is a circuit diagram of one embodiment of an integrated circuit having dynamic logic, indicated generally at 16. A P-channel transistor 18 has a drain connected to a high voltage supply, $V_{DD}$, a source connected to a first node, NODE 1, and a gate that receives a clock signal, CLK. A plurality of N-channel transistors 20 form a dynamic logic stage and are connected between node 1 and a second node, NODE 2. The gates of transistors 20 receive various logic inputs for the dynamic logic stage. An N-channel transistor 22 has a drain connected to the dynamic logic stage at NODE 2, a source connected to a low voltage supply (e.g., ground potential) and a gate that receives the control signal, CLK. In the embodiment of FIG. 2, NODE 1 operates as a dynamic node for the dynamic logic stage and feeds an invertor 24. The output of invertor 24 then represents the logic output of the dynamic logic stage.

In operation, the control signal, CLK, has a precharge phase and an evaluation phase in each clock cycle. The control signal, CLK, is low during the precharge phase such that transistor 18 is turned on and transistor 22 is turned off. During the precharge phase, the dynamic node, NODE 1, is charged by current flowing from the high voltage supply $V_{DD}$ into NODE 1. In other embodiments, the dynamic node could be precharged low during the precharge phase.

During the evaluation phase, the control signal, CLK, is high and transistor 18 is turned off and transistor 22 is turned on. This connects NODE 2 to the low voltage supply (ground potential) and isolates NODE 1 from the high voltage source supply, $V_{DD}$. If any of the logic branches in the dynamic logic stage formed by transistors 20 evaluate to form a current path between NODE 1 and NODE 2, then NODE 1 will be brought to the low voltage supply level. Otherwise, NODE 1 will remain at its high voltage level. In this manner, the dynamic logic stage can quickly produce a logic output responsive to inputs to the gates of transistors 20.

The leakage current discussed with respect to FIGS. 1A and 1B above causes problems with the dynamic logic of FIG. 2. The transistors 20 connected to NODE 1 can experience leakage pulses, $I_D$, that drain charge away from NODE 1 thus decreasing the charge on NODE 1. If the leakage current is sufficient to lower NODE 1 to below the logic threshold, an-inaccurate result may be produced by the dynamic logic stage. Thus, NODE 1 needs to be protected against such leakage currents. This is true of other types of dynamic nodes as well.

Figure 3:
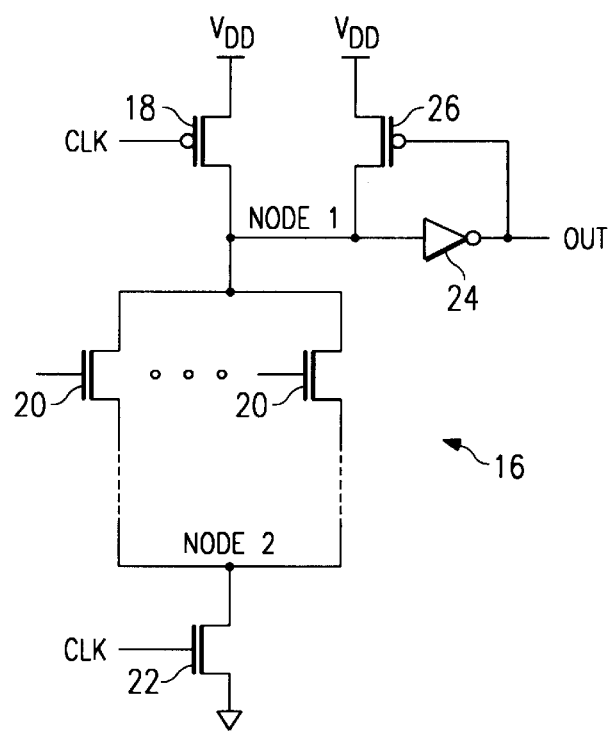
FIG. 3 is a circuit diagram of a conventional feedback stage for a dynamic node.

FIG. 3 is a circuit diagram of a conventional feedback stage for protecting a dynamic node, like NODE 1, from leakage current. As shown in FIG. 3, a keeper transistor 26 has been added to the circuit to provide feedback from the output of invertor 24 back to NODE 1. Transistor 26 comprises a P-channel transistor having a source connected to the high voltage supply, $V_{DD}$, a drain connected to the dynamic node, NODE 1, and a gate connected to the output of inverter 24. A loss of charge from NODE 1 causes a downward voltage pulse that is reflected by an upward voltage pulse at the output of inverter 24. The transistor 26 reacts to this upward voltage pulse by turning on and restoring charge to NODE 1. Thus, keeper transistor 26 provides feedback based upon the output of inverter 24 to pull up NODE 1. One significant aspect is that transistor 26 needs to be a weak P-channel transistor such that, when dynamic logic 16 is evaluated, it does not have to pull against a large transistor to pull NODE 1 to the low voltage supply.

The protection provided by the conventional feedback stage of FIG. 3 suffers from several problems. One problem is that if the leakage pulse is larger than the pull-up provided by transistor 26, then NODE 1 will be upset and reflect an incorrect voltage level. This problem generally cannot be solved by increasing the size of transistor 26 because it is undesirable to force transistors 20 to pull against a large transistor 26 during evaluation. Further, the voltage pulse from the output of inverter 24 shuts off transistor 26 thus prematurely terminating the supply of current back into NODE 1. This prevents transistor 26 from correcting the charge on the dynamic node, NODE 1.

Figure 4:
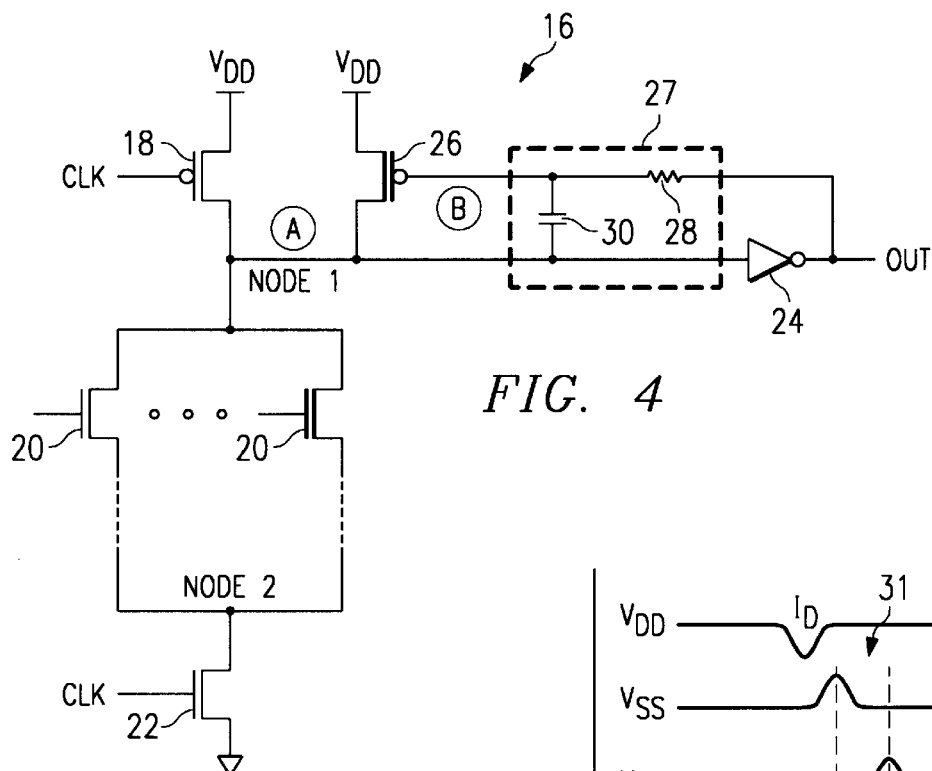
FIG. 4 is a circuit diagram of one embodiment of a feedback stage for a dynamic node according to the teachings of the present invention.

FIG. 4 is a circuit diagram of one embodiment of a feedback stage for a dynamic node according to the teachings of the present invention. The circuit of FIG. 4 is similar to that of FIG. 3 with the addition of a delay stage 27. In the embodiment of FIG. 4, delay stage 27 comprises a resistor 28 connected between the output of invertor 24 and the gate of transistor 26. Delay stage 27 also includes a capacitor 30 connected between the gate of transistor 26 and the dynamic node, node 1. According to the present invention, delay stage 27 provides a delay in the feedback greater than any intrinsic circuit delay which allows transistor 26 to recharge the dynamic node, NODE 1, before being shut off by a voltage pulse from the output of invertor 24. For example, the delay provided by delay stage 27 can typically be 0.5 nanoseconds or greater. Delay stage 27 provides advantages over the conventional circuit of FIG. 3 by protecting against a larger upset pulse for a given size of keeper transistor 26. Thus, the present invention provides for a smaller keeper transistor 26 in relation to the size of expected upset pulses. Because of the delay provided by delay stage 27, transistor 26 is not shut off before it can recharge node 1. Further, by allowing a smaller keeper transistor 26, delay stage 27 reduces the size of the transistor against which transistors 20 must pull in order to pull NODE 1 to the low voltage supply. The capacitance provided by capacitor 30 can alternatively be produced by adding a transistor across the gate and drain of transistor 26 or can be produced by enhancing the inherent gate-drain capacitor of transistor 26. For example, changing the layout of transistor 26 to produce a larger gate to drain overlap would increase the inherent capacitance. For some applications, the inherent gate capacitance of transistor 26 may be sufficient. It should be understood that the delay stage of the present invention is applicable to dynamic nodes that feed logic gates other than an invertor and that an output can be taken from the dynamic node separately from the feedback path. Particularly, in the case where the output is taken separately from the feedback path, the impedance of a logic gate within the feedback path such as inverter 24, can be made sufficient such that a separate resistor 28, is not needed. Further, transistor 26 can alternatively be another form of controllable current path having a control terminal that allows the path to be selectively open or closed.

Figure 5:
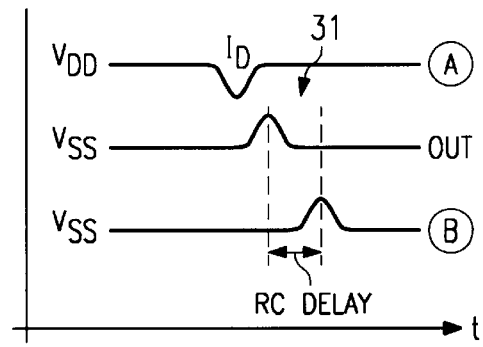
FIG. 5 is a timing diagram of voltage levels associated with the protection provided by the feedback stage of FIG. 4.

FIG. 5 is a timing diagram of voltage levels associated with the protection provided by the feedback stage of FIG. 4. As shown, the voltage level at the dynamic node, NODE 1 may experience a downward pulse due to leakage current through transistors 20. After the downward pulse at NODE 1, an upward voltage pulse is generated at the output of invertor 24. Delay stage 27 then delays the upward voltage pulse such that it arrives at the gate of transistor 26 delayed with respect to its appearance at the output of invertor 24. This delay allows transistor 26 to remain on and recharge NODE 1 to its desired level prior to being shut off by the voltage pulse. Capacitor 30 can be connected from the gate of transistor 26 to some other node, such as a supply node, and still provide the desired delay in the feedback. However, connection of capacitor 30 between NODE 1 and the gate of transistor 26, as shown, has an additional benefit of increasing the restoration current as the gate of transistor 26 is coupled low with the noise pulse on NODE 1. The effectiveness of this coupling is increased by resistor 28.

Figure 6:
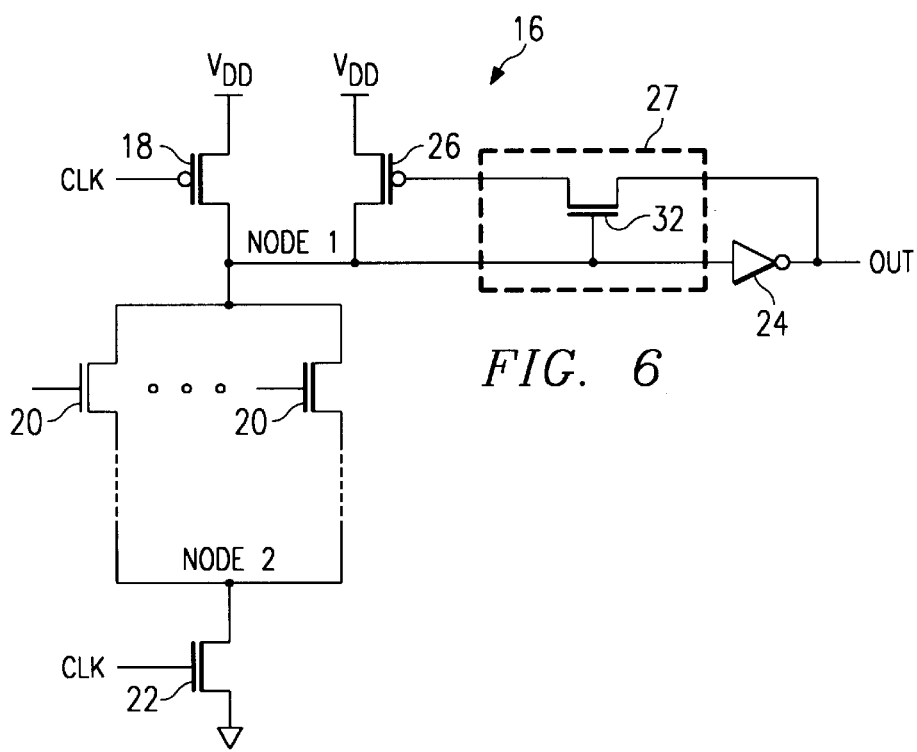
FIG. 6 is a circuit diagram of another embodiment of a feedback stage for a dynamic node according to the teachings of the present invention.

FIG. 6 is a circuit diagram of another embodiment of a feedback stage for a dynamic node according to the teachings of the present invention. As shown, delay stage 27 of FIG. 6 comprises an accumulation mode transistor 32. Transistor 32 has a source connected to the output of invertor 24, a drain connected to the gate of transistor 26, and a gate connected to the dynamic node, NODE 1. In general, an accumulation mode transistor is a transistor that is on when there is zero gate-source voltage. Such a transistor 32 appears to the circuit like a resistor with a distributed capacitance produced by the gate-to-channel capacitance of the transistor. In this embodiment, transistor 32 provides the RC delay stage similar to that provided by resistor 28 and capacitor 30 shown in FIG. 4. In any case, the delay stage of the present invention provides benefits to any integrated circuit having a dynamic node that feeds a logic gate and in particular provides advantages to integrated circuits having dynamic logic and dynamic nodes analogous to those shown in FIGS. 4 and 6.

Although the present invention has been described in detail, it should be understood that various changes, substitutions and alterations can be made hereto without departing from the spirit and scope of the invention as defined by the appended claims. For example, the dynamic node could be precharged low.

What is claimed is:

1. An integrated circuit having dynamic logic, the integrated circuit comprising:
   a dynamic node;
   a feedback stage for protecting the dynamic node, the feedback stage comprising:
      a controllable current path connected between a voltage supply and the dynamic node, the controllable current path having a control terminal; and
      a feedback path from the dynamic node to the control terminal, the feedback path including a delay stage having a capacitance that is independent of any intrinsic dynamic logic device capacitance associated with the integrated circuit to provide a delay greater than intrinsic circuit delay.

2. The integrated circuit of claim 1, wherein:
   the feedback path comprises a logic gate, the logic gate comprising an input connected to the dynamic node and an output connected to the delay stage; and
   the delay stage is further connected to the control terminal of the controllable current path, the delay stage providing a delayed signal from the output of the logic gate to the control terminal.

3. The integrated circuit of claim 1, wherein the delay stage provides a 0.5 nanosecond or greater delay.

4. The integrated circuit of claim 1, wherein the delay stage comprises capacitive coupling from the dynamic node to the control terminal.

5. The integrated circuit of claim 2, wherein the logic gate comprises an inverter.

6. The integrated circuit of claim 1, wherein the controllable current path comprises a P-channel transistor having a source connected to the voltage supply, a drain connected to the dynamic node, and a gate as the control terminal.

7. The integrated circuit of claim 1, wherein the delay stage is connected to the dynamic node.

8. The integrated circuit of claim 2, wherein the delay stage comprises:
   a resistor connected between the output of the logic gate and the control terminal; and
   a capacitor connected between the control terminal and the dynamic node.

9. The integrated circuit of claim 2, wherein the delay stage comprises:
   a transistor configured to be on with zero gate-source voltage and having a first drain-source area connected to the output of the logic gate, a second drain-source area connected to the control terminal, and a gate connected to the dynamic node.

10. A feedback stage for protecting a dynamic node associated with a dynamic logic stage, the dynamic node connected to an input of a logic gate, the feedback stage comprising:
    a controllable current path connected between a voltage supply and the dynamic node, the controllable current path having a control terminal; and
    a delay stage connected to an output of the logic gate and to the control terminal of the controllable current path, the delay stage having a capacitance that is independent of any intrinsic capacitance associated with the logic gate and that is further independent of any intrinsic capacitance associated with the controllable current path to provide a delayed signal from the output of the logic gate to the control terminal, and the delayed signal delayed by more than intrinsic circuit delay.

11. The feedback stage of claim 10, wherein the controllable current path comprises a P-channel transistor having a source connected to the high voltage supply, a drain connected to the dynamic node and a gate as the control terminal.

12. The feedback stage of claim 10, wherein the delay stage is further connected to the dynamic node.

13. The integrated circuit of claim 12, wherein the delay stage comprises:
   a resistor connected between the output of the logic gate and the control terminal; and
   a capacitor connected between the control terminal and the dynamic node.

14. The feedback stage of claim 12, wherein the delay stage comprises:
   a transistor configured to be on with zero gate-source voltage and having a first drain-source area connected to the output of the logic gate, a second drain-source area connected to the control terminal, and a gate connected to the dynamic node.

15. The feedback stage of claim 10, wherein the delay stage provides a 0.5 nanosecond or greater delay.

16. A method for protecting a dynamic node associated with a dynamic logic stage with a feedback stage, the method comprising:
   connecting a controllable current path between a voltage supply and the dynamic node, where the controllable current path has a control terminal; and
   connecting a feedback path from the dynamic node to the control terminal, the feedback path including a delay stage having a capacitance that is independent of any intrinsic capacitance associated with the dynamic logic stage;
   such that the feedback path provides a delayed signal from the dynamic node to the control terminal, the delayed signal delayed by more than intrinsic circuit delay.

17. The method of claim 16 wherein connecting the feedback path comprises:
   connecting a logic gate such that an input of the logic gate is connected to the dynamic node and an output of the logic gate is connected to the delay stage; and
   connecting the delay stage to the control terminal of the controllable current path.

18. The method of claim 16, wherein connecting the controllable current path comprises connecting a source of a P-channel transistor to the voltage supply, a drain of the P-channel transistor to the dynamic node and a gate of the P-channel transistor as the control terminal.

19. The method of claim 16, further comprising connecting the delay stage to the dynamic node.

20. The method of claim 19, wherein connecting the delay stage comprises:
   connecting a resistor between the output of the logic gate and the control terminal; and
   connecting a capacitor between the control terminal and the dynamic node.

21. The method of claim 19, wherein connecting the delay stage comprises:
   connecting a drain of a transistor, configured to be on with zero gate-source voltage, to the output of the logic gate, connecting a source of the accumulation mode transistor to the control terminal, and connecting a gate of the accumulation mode transistor to the dynamic node.

22. The method of claim 16, wherein the delayed signal is delayed by 0.5 nanoseconds or greater delay.

* * * * *